(12) United States Patent
Wang et al.

(10) Patent No.: US 7,977,655 B2
(45) Date of Patent: Jul. 12, 2011

(54) METHOD AND SYSTEM OF MONITORING E-BEAM OVERLAY AND PROVIDING ADVANCED PROCESS CONTROL

(75) Inventors: Jo Fei Wang, Hsin-Chu (TW); Ming-Yu Fan, Hsinchu County (TW); Jong-I Mou, Hsinpu Township, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 236 days.

(21) Appl. No.: 12/470,228

(22) Filed: May 21, 2009

(65) Prior Publication Data

US 2010/0294955 A1   Nov. 25, 2010

(51) Int. Cl.
*G03F 7/00* (2006.01)
*G03F 7/20* (2006.01)

(52) U.S. Cl. ............. 250/492.22; 250/492.2; 250/492.3; 430/302; 382/145

(58) Field of Classification Search ............. 250/492.22, 250/492.2, 492.3; 430/302; 382/145
See application file for complete search history.

(56) References Cited

U.S. PATENT DOCUMENTS 7,292,308 B2 * 11/2007 Galburt et al. .................. 355/47
7,871,002 B2 * 1/2011 Smith et al. .................... 235/454
* cited by examiner

*Primary Examiner* — Nikita Wells
(74) *Attorney, Agent, or Firm* — Haynes and Boone, LLP

(57) ABSTRACT

A method for monitoring overlay of a direct-write system. The method includes providing a substrate having a pattern formed thereon by the direct-write system, generating data associated with the substrate pattern, decomposing the data by applying a transformation matrix, and determining an overlay index based on the decomposed data, the overlay index corresponding to a variation component of the substrate pattern relative to a target pattern.

20 Claims, 9 Drawing Sheets

US 7,977,655 B2

METHOD AND SYSTEM OF MONITORING E-BEAM OVERLAY AND PROVIDING ADVANCED PROCESS CONTROL

BACKGROUND

Photolithography or optical lithography is generally known as a process that is used in micro fabrication to selectively remove parts of thin films on a substrate. Photolithography generally uses a directed light source to transfer a geometric pattern from a photomask to a light-sensitive chemical resist material that is formed on the substrate, thus generating an exposure pattern in the resist material from the light radiation. A series of chemical treatments may then be used to etch or otherwise transfer the exposure pattern into one or more thin film layers positioned underneath the resist layer.

More recent lithography-type systems for micro fabrication operate to transfer or generate an exposure pattern in a resist layer without the intermediary step of creating a photomask. For example, a direct-write (DW) exposure tool operates to write patterns directly into one or more layers on a substrate. The pattern is generally written from an electronic or computer-type file that is used to control a precision exposure source that may be selectively directed onto the layers of the substrate. More particularly, a DW exposure tool is generally configured such that the exposure of a circuit pattern is made not by illumination of the photo-resist through a mask or film negative of the circuit, but rather by directly and selectively exposing the desired areas of the resist or other layer on a substrate with a focused beam of the appropriate energy and dosage to create the desired circuit pattern. However, monitoring and controlling an overlay of the beam is complex, and thus may result in poor performance.

SUMMARY

One of the broader forms of an embodiment of the present invention involves a method for monitoring overlay of a direct-write system. The method includes providing a substrate having a pattern formed thereon by the direct-write system; generating data associated with the substrate pattern; decomposing the data by applying a transformation matrix; and determining an overlay index based on the decomposed data, the overlay index corresponding to a variation component of the substrate pattern relative to a target pattern. In some embodiments, the substrate includes a wafer. In some other embodiments, the substrate includes a photomask.

Another one of the broader forms of an embodiment of the present invention involves a method for controlling a direct-write system. The method includes patterning a current substrate by the direct-write system; determining metrology data of the patterned current substrate; decomposing the metrology data to determine an overlay type of the patterned current substrate relative to a target pattern; and patterning a next substrate by controlling the direct-write system based on the determined overlay type. In some embodiments, the substrate includes a wafer. In some other embodiments, the substrate includes a photomask.

Yet another one of the broader forms of an embodiment of the present invention involves a direct-write system. The direct-write system includes an exposure module that includes a beam for writing to a current substrate; and a controller operable to execute instruction that: receive data of a previous substrate that has been patterned by the exposure module; decompose the data by applying a transformation matrix; determine an overlay index based on the decomposed data, the overlay index corresponding to a variation component of the previous substrate pattern relative to a target pattern; and control the exposure module to write to the current substrate based on the overlay index. In some embodiments, the substrate includes a wafer. In some other embodiments, the substrate includes a photomask.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The present disclosure relates generally to semiconductor manufacturing and more particularly, to a system and method for monitoring and controlling overlay of a direct-write system. It is understood, however, that specific embodiments are provided as examples to teach the broader inventive concept, and one of ordinary skill in the art can easily apply the teaching of the present disclosure to other methods or devices. In addition, it is understood that the methods and system discussed in the present disclosure include some conventional structures and/or processes. Since these structures and processes are well known in the art, they will only be discussed in a general level of detail. Furthermore, reference numbers are repeated throughout the drawings for sake of convenience and example, and such repetition does not indicate any required combination of features or steps throughout the drawings.

Figure 1:
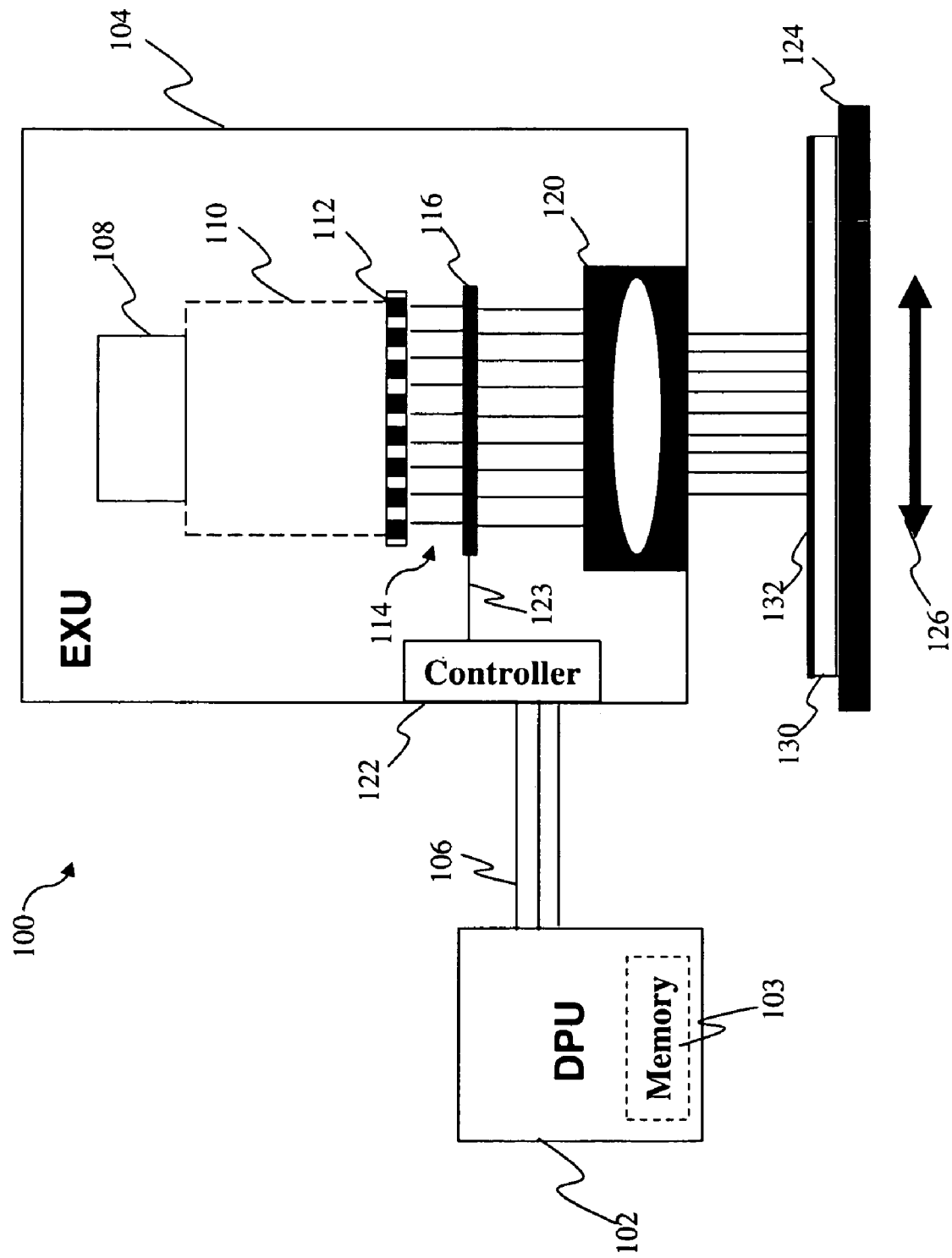
FIG. 1 is a diagrammatic view of a direct-write (DW) system accordingly to various aspects of the present disclosure.

Referring to FIG. 1, illustrated is a diagrammatic view of an exemplary direct-write (DW) system 100. The DW system 100 includes a data processing unit 102 (DPU) and an exposure unit 104 (EXU). The DPU 102 (DPU) is configured to read patterning data from a data storage medium, which may be within the DPU 102 or remotely positioned and in communication with the DPU 102. The DPU 102 obtains the patterning data and loads it into its memory 103. The DPU 102 processes the patterning data and generates a pattern writing instruction set, and sends the writing instruction set to the EXU 104. Depending on the form of the stored patterning data, when the patterning data includes an EXU writing instruction, the function of the DPU is reading, loading, and sending, as noted above. However, when the stored pattern data is a raw GDS-type file from a circuit designer, then the DPU 102 may also perform proximity correction and transformation to the writing instruction instructions for the EXU 104. Alternatively, the proximity correction and transformation may optionally be performed separately by a standalone module. The writing instruction set are preferably sent on one or more optical fibers 106 using light radiation as carriers of the information as will be discussed later herein. The high bandwidth associated with the optical fibers 106 supports high data transmission rates, and is well suited to transfer the large quantity of data from the DPU 102 to the EXU 104 at a sufficient rate in order to write the patterning data properly.

The EXU 104 includes a source 108 that is configured to generate at least one energized beam 110. In the present embodiment, the energized beam 110 is an electron beam (referred to as E-beam). Alternatively, the energized beam may optionally include a photon beam or ion beam. The beam 110 may pass through one or more lenses (not shown) and may be focused to a beam aperture portion 112. The beam aperture portion 112 is configured with a plurality of apertures or openings that split the beam 110 into a plurality of beams 114. The number of beams 114 may vary depending on the design requirements of the DW system 100 as will be discussed later herein. The plurality of beams 114 may travel to a beam controller 116 that is configured to allow one or more of the beams to pass through to an imaging head 120, or to block/blank one or more of the beams 114 from passing through to the imaging head. The imaging head 120 includes an electron optical system for focusing the beams that are allowed to pass through. The beam controller 116 may include a plurality of deflectors that are controlled by electrical control signals that are associated with the writing instructions sent from the DPU 102. When the deflector is not energized, the corresponding beam is allowed to pass through to the imaging head 120. When the deflector is energized, an electrical field is generated that deflects the corresponding beam such that the beam is blocked from passing through to the imaging head 120.

The EXU 104 may further include a controller 122 that receives the writing instructions from the DPU 102 via the optical fibers 106. The writing instructions are sent using light radiation as carriers of the information. Accordingly, the controller 122 includes a plurality of light-to-electrical converters, such as photodiodes, that convert the light signals (e.g., writing instructions) into electrical control signals which are used to control 123 the deflectors of the beam controller 116 as discussed above. The DW system 100 further includes a stage 124 that is configured to move 126 in various directions. The stage 124 may hold and secure a substrate 130 by a vacuum system or other suitable securing mechanism. The substrate 130 may include a semiconductor wafer, a mask blank, a glass substrate, and a flat panel substrate. For example, the substrate 130 may include silicon, germanium, diamond, or a compound semiconductor. Alternatively, the substrate 130 may include other types of substrates such as glass for thin-film transistor liquid crystal display (TFT_LCD) devices or fused silicon/calcium fluoride for photomasks or reticles.

The substrate 130 includes a recording medium 132, such as a photoresist, formed thereon. During processing, the substrate 130 is moved or scanned relative to the imaging head 120 and in cooperation with the controller 122. The beams 114 that pass through to the imaging head 120 are focused, by the electron optical system, onto the recording medium 132 such that the desired pattern is written directly into the recording medium (without a photomask or reticle). After the entire substrate 130 has been scanned, the recording medium 132 is developed to form the pattern over the substrate 130, and other processing, such as etching and doping, may be performed using the patterned recording medium. For example, the substrate 130 may include a wafer that is patterned with various features to form an integrated circuit. In another example, the substrate 130 may include a photomask that is patterned with various features to form a mask pattern for a lithography process. It is understood that the DW system 100 may include other components such as an alignment system and collimator, but is simplified for a better understanding of the disclosed embodiments herein.

Figure 2:
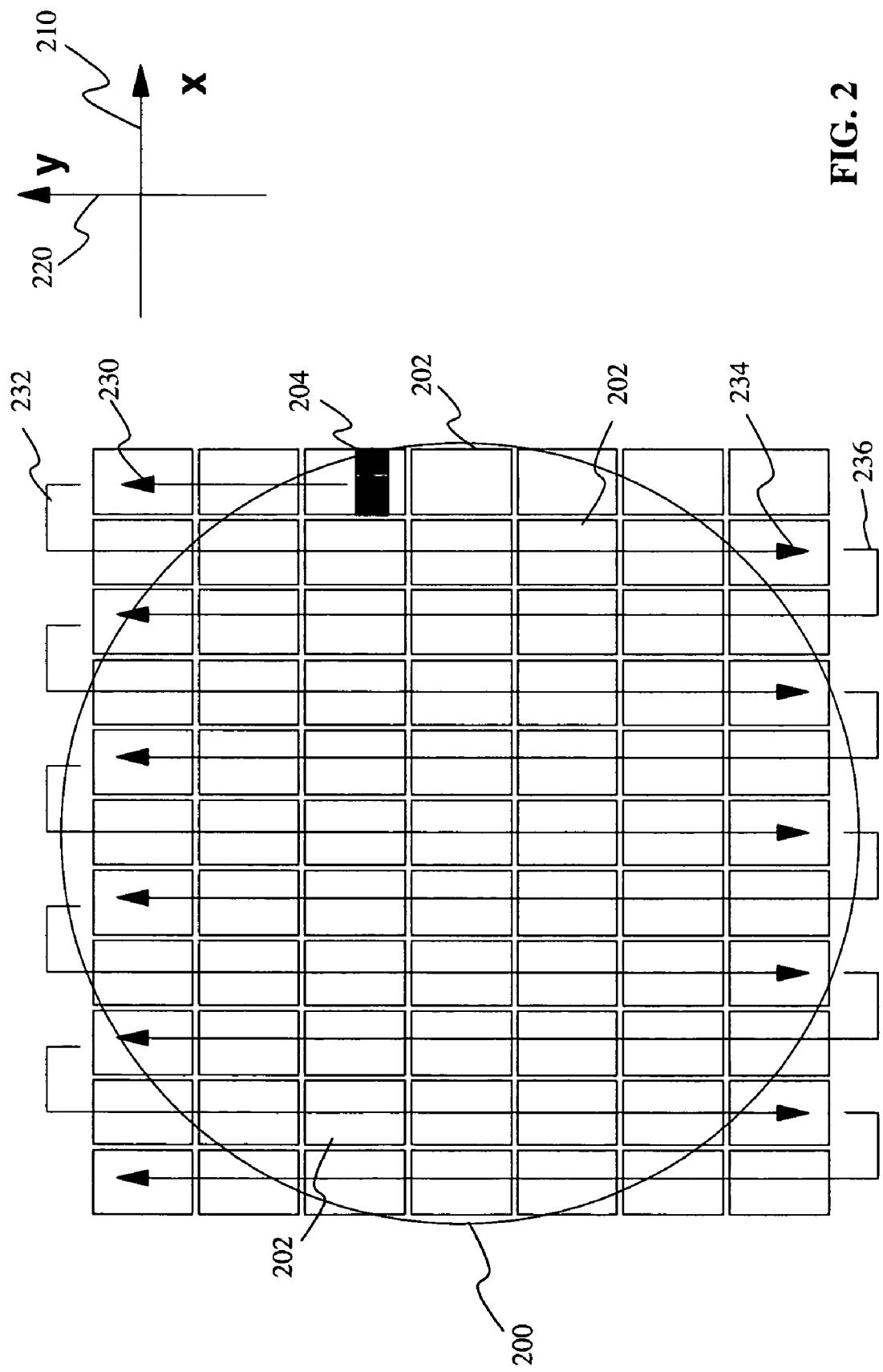
FIG. 2 is a top view of a substrate being scanned by a DW system having a plurality of beams.

Referring to FIG. 2, illustrated is a top view of a substrate 200 being scanned with a DW system 100 of FIG. 1. The substrate 200 includes a plurality of fields 202 in which the desired pattern is written onto. The size of the field 202 may vary depending on design requirements. In the present example, the field size is 26 mm by 40 mm or less. The field 202 may include at least one die that is repeated over the entire substrate 200. It is preferred to assemble as many chips (e.g., independently functioning circuits) into the die to minimize the steps required to expose the entire substrate, and thus maximize the substrate throughput. A plurality of beams may be confined within an exposure area 204. Accordingly, the exposure area 204 may be sufficient to directly write the field 202 as the substrate 200 is scanned in one direction.

As discussed above, the substrate 200 may be secured to a stage (not shown) that is similar to the stage 124 of FIG. 1. The stage is configured to move in an x-direction 210 and a y-direction 220 so that the entire substrate 200 can be scanned and directly written to by a plurality of beams. For example, the substrate 200 (via the stage) is moved in a direction 230 along the y-direction 220, and the writing instructions control the plurality of beams to write the desired pattern to the field 202. The writing instructions are repeated as the exposure area 204 to the next field 202 and so forth. When the exposure area 204 approaches an edge of the substrate 200, the stage continues to move such that the exposure area 204 goes beyond the substrate edge at a sufficient distance to facilitate a change in direction 232. The substrate 200 is then moved in an opposite direction 234 along the y-direction 220 during exposure until the exposure area 204 again reaches the substrate edge. However, the writing instructions are reversed since the desired pattern is written in the opposite direction 234 as compared to direction 230. The substrate 200 continues to move such that the exposure area 204 goes beyond the substrate edge to again facilitate a change in direction 236. The DW system repeats this process to write the desired pattern for each field 202 on the substrate 200.

Referring to FIG. 3A-3D, illustrated are top views of possible types of overlay of a DW system. An overlay performance of the DW system involves how accurate the DW system is writing a pattern of the field onto the substrate. That is, whether the patterned field is positioned at a desired or target area on the substrate. It has been observed that the patterned field may vary relative to the target due to various factors such as components (e.g., lens) of the DW system, composition of the imaging layer, operating environment, calibration process, and control process. In the various top views, a target field 305 is shown as a rectangular shape (with dashed lines) for the sake of convenience and clarity. The target field 305 represents the desired position and size of the field to be written or patterned onto the substrate. The actual fields that are written/patterned may vary from the target field 305, and a type of overlay of the actual field can be characterized based on a geometric variation of the actual field relative to the target field 305 as discussed below.

Figure 3B:
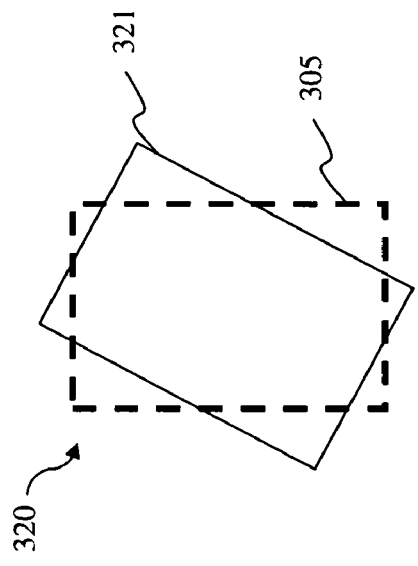
FIGS. 3A-3D are top views of various types of overlay of a patterned field relative to a target field.
Figure 3D:
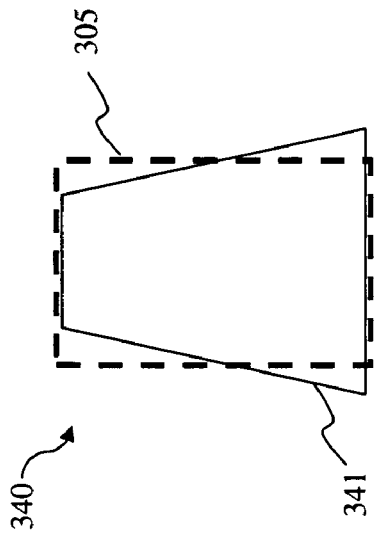
Figure 3A:
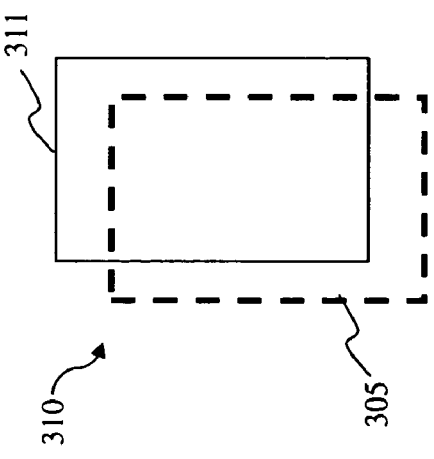

In FIG. 3A, the overlay type can be characterized as including a translational shift component 310 as shown by a patterned field 311. The patterned field 311 is shifted in an x-direction and a y-direction (perpendicular to the x-direction). The amount of shift in the x-direction and/or y-direction may be the same or different. It should be noted that the translational shift component may also occur in one direction, either the x-direction or y-direction.

In FIG. 3B, the overlay type can also be characterized as including a rotational component 320 as shown by a patterned field 321. The patterned field 321 is rotated relative to the target field 305. The axis of rotation is about a center of the target field 305. It should be noted that the amount of rotation may vary.

Figure 3C:
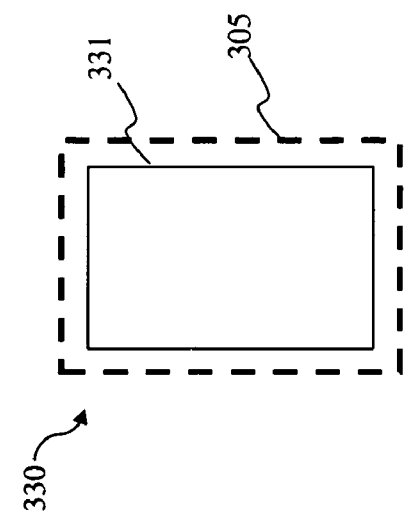

In FIG. 3C, the overlay type can also be characterized as including a magnification component 330 as shown by a patterned field 331. In the present example, the patterned field 331 is magnified with a factor that less than one (also referred to as dilation. That is, the patterned field 331 is shrunk in both the x-direction and the y-direction relative to the target field 305. It should be noted that the patterned field may be enlarged relative to the target field 305 in some situations. Further, in other situations, the patterned field may be shrunk in one direction and enlarged in the other direction.

In FIG. 3D, the overlay type can also be characterized as including a trapezoidal component 340 as shown by a patterned field 341. The patterned field 341 includes a portion of the target field 305 that is contracted and another portion of the target field that is stretched thereby distorting the rectangular shape into a trapezoidal shape. The patterned field 341 is shown as being distorted in an x-direction. It should be noted that the distortion may also occur in a y-direction such that one side portion is contracted and the other side portion is stretched.

Although the patterned fields 311, 321, 331, and 341 are discussed independently above, it is understood that an actual field may include any combination of the geometric variations. For example, the actual field may include a translational shift component and a rotational component. Accordingly, it is important to decompose each component (or overlay type) from the measured data to evaluate the overlay performance as will be discussed later below. Further, it is understood that other types of overlay of the patterned field may exist such as S-shaped, twisting shaped, hat shaped, zig-zag shaped, or any other proper configuration. The overlay type is important information that will be used to determine the quality of the patterning process, and to provide control, calibration, and preventive maintenance of the DW system.

Figure 4:
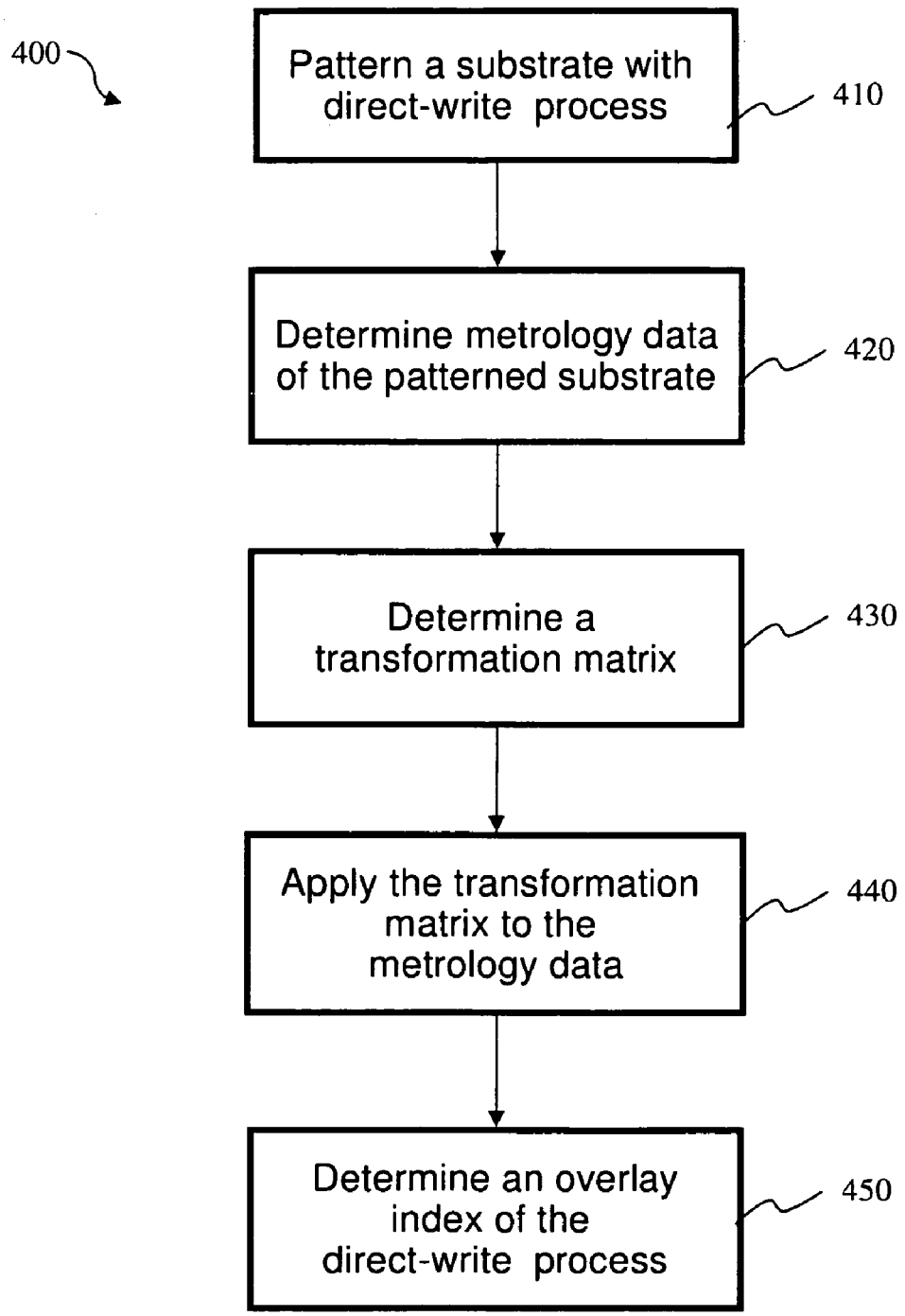
FIG. 4 is a flowchart of a method for monitoring and controlling overlay of a direct-write system according to various aspects of the present disclosure.

Referring to FIG. 4, illustrated is flowchart of a method 400 for monitoring overlay of a direct-write process according to various aspects of the present disclosure. The method 400 begins with block 410 in which a substrate is patterned by a direct-write process. The direct-write process may utilize an E-beam of the DW system of FIG. 1. The method 400 continues with block 420 in with the patterned substrate is inspected by a metrology tool. The metrology tool may include any proper microscopy tool that is cable of measuring overlay information including reference or control points of one or more patterned fields on the substrate, and determining the position of the reference points relative to respective target points. The number and location of the reference points may vary.

Figure 5:
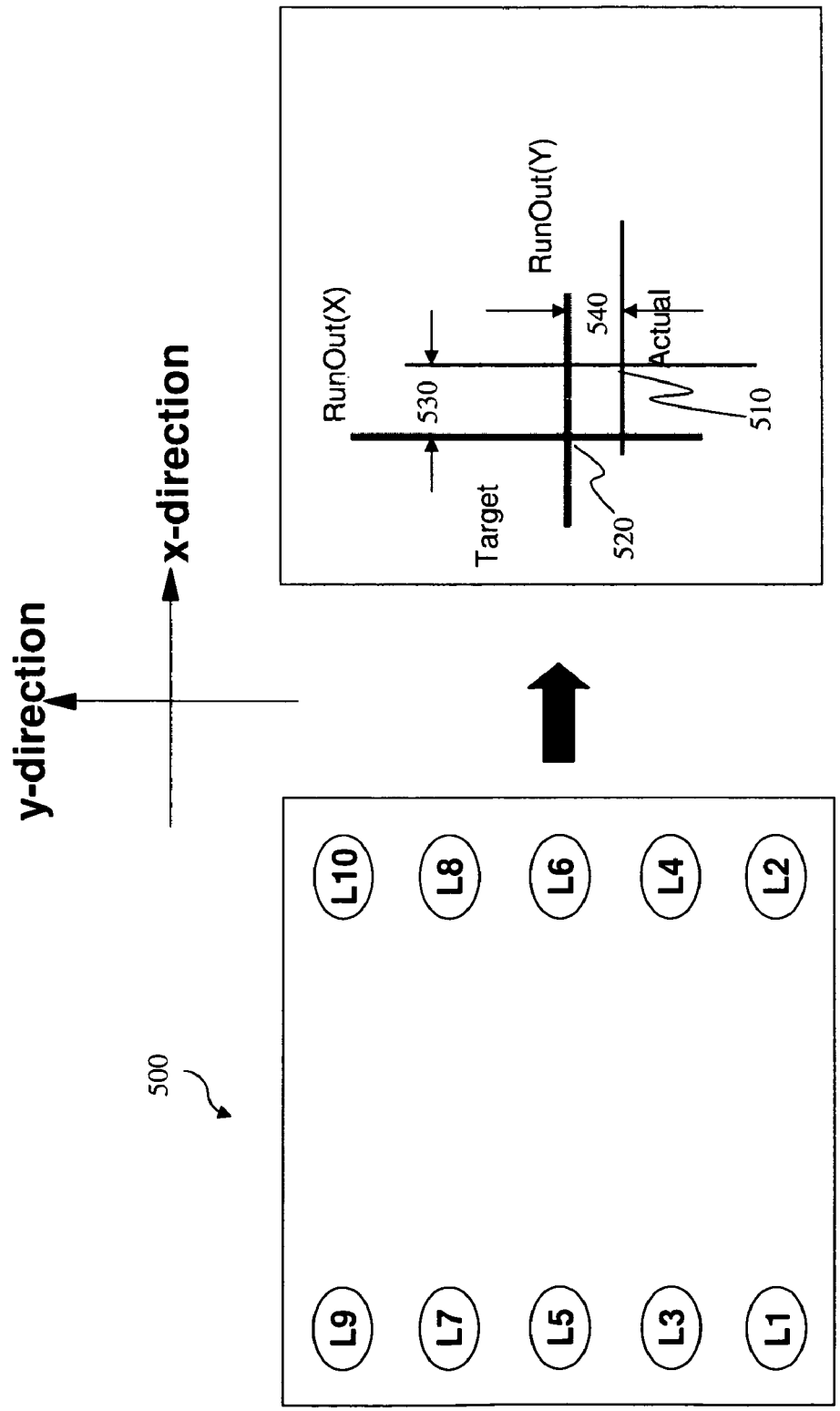
FIG. 5 is a graphical view of a technique to determine various types of overlays on a photomask.

The method 400 continues with block 430 in which a transformation matrix is determined. The transformation matrix is configured to extract components due to geometric variation such as translational shift, magnification, rotation, and trapezoid as was discussed with reference to FIGS. 3A-3D. Referring also to FIG. 5, illustrated is a graphical representation of a technique to determine various types of overlay on a photomask. A plurality of locations or reference points 500 may be selected for measuring the overlay on the substrate. In present embodiment, ten (10) locations (L1-L10) are measured for characterizing a type of overlay. The overlay is determined by evaluating an actual/measured point 510 (in block 420) in relation to a target point 520. Accordingly, the measured overlay may include a runout 530 in an x-direction (e.g., RunOut(X)) and a runout 540 in a y-direction (e.g., RunOut(Y)).

Figure 6A:
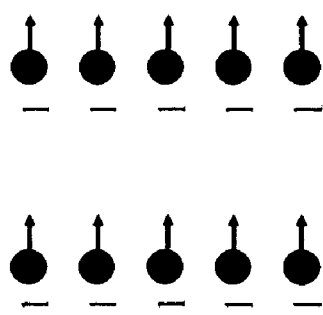
FIGS. 6A-6B are diagrammatic views of an overlay type including a translational shift component expressed in an x-direction and a y-direction.
Figure 6B:
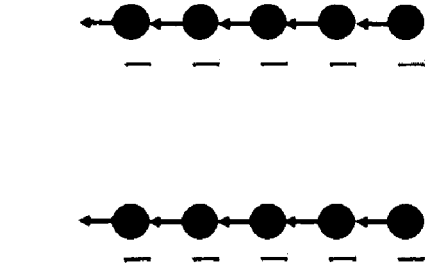

Referring also to FIGS. 6A and 6B, illustrated are graphical representations of an overlay including a translation shift component expressed in an x-direction and a y-direction, respectively. In FIG. 6A, the translation shift component in the x-direction is shown with the locations (L1-L10 of FIG. 5). All the locations (L1-L10) are shown shifted one unit to the right (1) in the x-direction. In FIG. 6B, the translational shift component in the y-direction is shown with the locations (L1-L10). All the locations (L1-L10) are shown shifted one unit upwards (1) in the y-direction. It is understood that the convention for describing the direction (e.g., right, left, upward, downward) and amount (e.g., one unit, two unit) of the various overlay types is a mere example, and that other conventions may be used without departing from the spirit and scope of the present disclosure.

Figure 7A:
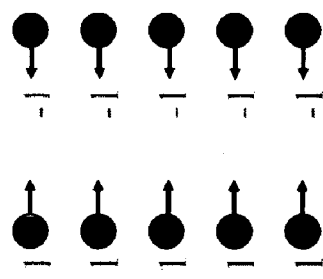
FIGS. 7A-7B are diagrammatic views of an overlay type including a magnification component expressed in an x-direction and a y-direction.
Figure 7B:
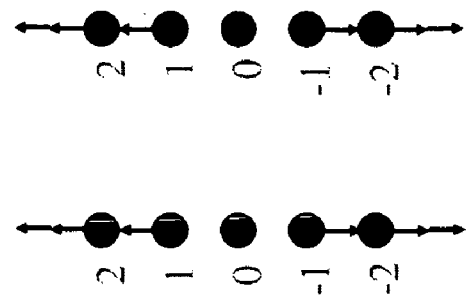

Referring also to FIGS. 7A and 7B, illustrated are graphical representations of an overlay including a magnification component expressed in an x-direction and a y-direction, respectively. In FIG. 7A, the magnification component in the x-direction is shown with locations (L1, L3, L5, L7, and L9) shifted one unit to the right (1), and the other locations (L2, L4, L6, L8, and L10) shifted one unit to the left (−1). In FIG. 7B, the magnification component in the y-direction is shown with locations (L9 and L10) shifted two units upwards (2), locations (L7 and L8) shifted one unit upwards (1), locations (L5 and L6) with no shift (0), locations (L3 and L4) shifted one unit downwards (−1), and locations (L1 and L2) shifted two units downwards (−2).

Figure 8A:
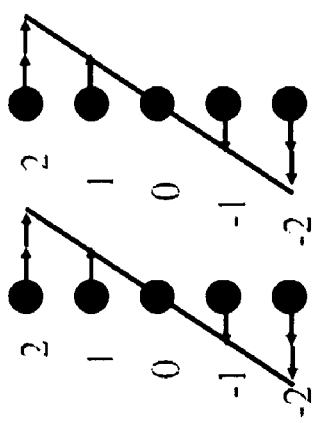
FIGS. 8A-8B are diagrammatic views of an overlay type including a rotational component expressed in an x-direction and a y-direction.
Figure 8B:
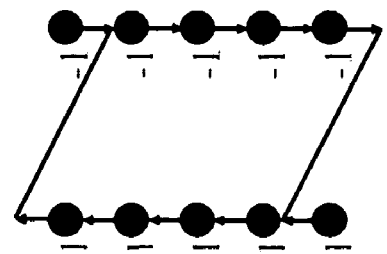

Referring also to FIGS. 8A and 8B, illustrated are graphical representations of an overlay including a rotational component expressed in an x-direction and a y-direction, respectively. In FIG. 8A, the rotational component in the x-direction is shown with locations (L9 and L10) shifted by two units to the right (2), locations (L7 and L8) shifted one unit to the right (1), locations (L5 and L6) with no shift (0), locations (L3 and L4) shifted one unit to the left (−1) and locations (L1 and L2) shifted two units to the left (−2). In FIG. 8B, the rotational component in the y-direction is shown with locations (L1, L3, L5, L7, and L9) shifted one unit upwards (1), and locations (L2, L4, L6, L8, and L10) shifted one unit downwards (−1).

Figure 9A:
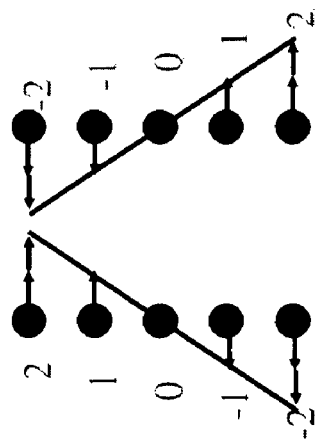
FIGS. 9A-9B are diagrammatic views of an overlay type including a trapezoidal component expressed in an x-direction and y-direction.
Figure 9B:
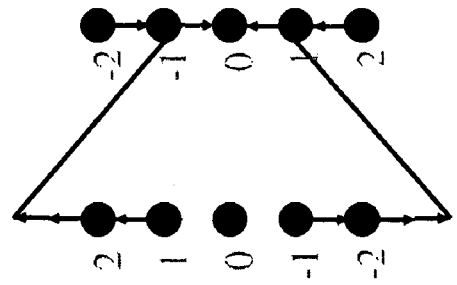

Referring also to FIGS. 9A and 9B, illustrated are graphical representations of an overlay including a trapezoidal component expressed in an x-direction and a y-direction, respectively. In FIG. 9A, the trapezoidal component in the x-direction is shown with locations (L9 and L2) shifted two units to the right (2), locations (L7 and L4) shifted one unit to the right (1), locations (L5 and L6) with no shift (0), locations (L3 and L8) shifted one unit to the left (−1) and locations (L1 and L10) shifted two units to the left (−2). In FIG. 9B, the trapezoidal component in the y-direction is shown with locations (L9 and L2) shifted two units to upwards (2), locations (L7 and L4) shifted one unit upwards (1), locations (L5 and L6) with no shift (0), locations (L3 and L8) shifted one unit downwards (−1), and locations (L1 and L10) shifted two units downwards (−2).

Figure 10:
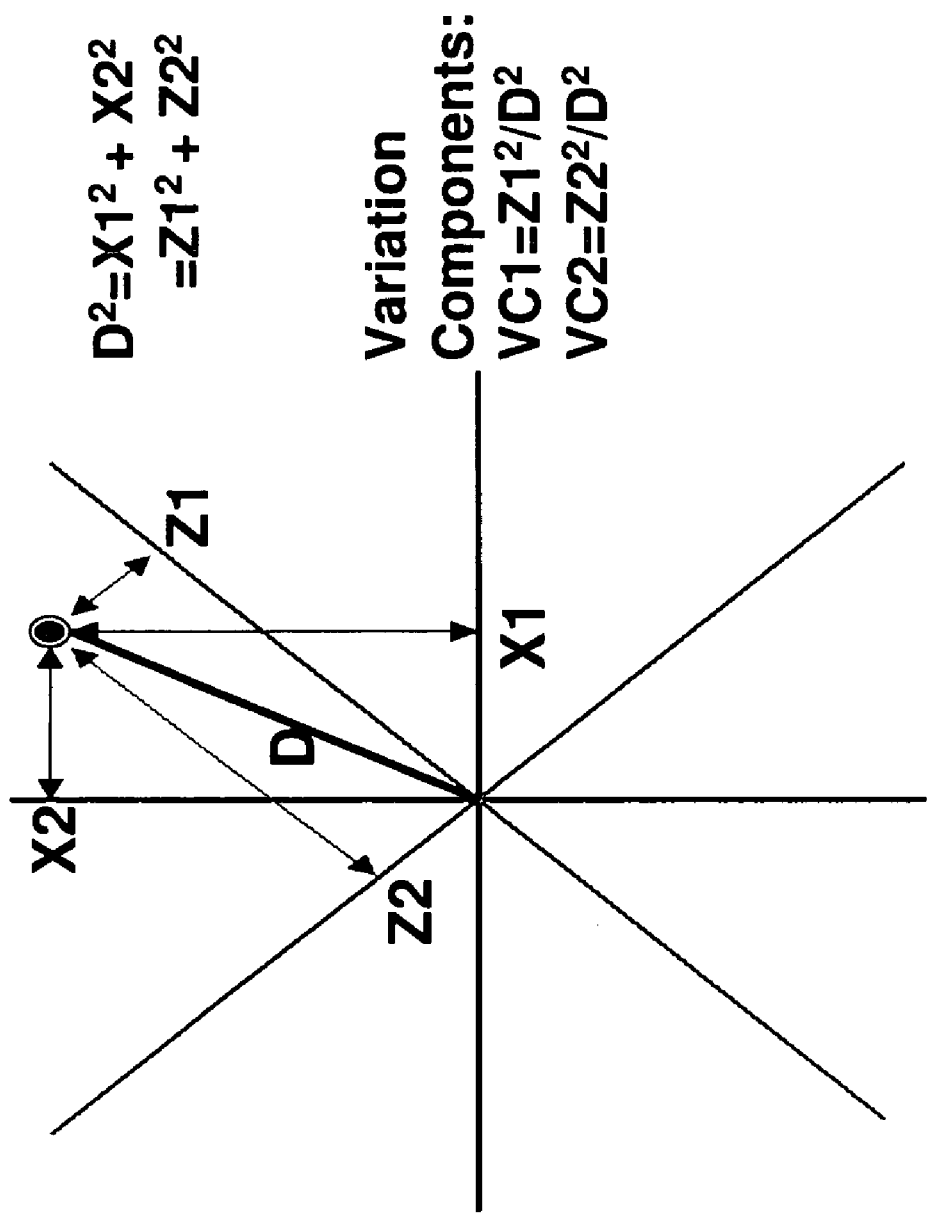
FIG. 10 is a graphical view of a technique to extract variation components for a decomposed orthogonal transformation matrix.

Referring also to the table shown below, illustrated is an embodiment of a decomposed orthogonal transformation matrix. The orthogonal transformation may extract the various components (e.g., translational shift, rotation, magnification, trapezoid, etc.) due to geometric variation as illustrated in FIG. 10. In FIG. 10, variation components for each direction (VC1 and VC2) is approximately equal to a square of the shift divided by a square of the distance ($Z1^2/D^2$ and $Z2^2/D^2$). As previously noted with reference to block 420, the metrology data includes measurements of various reference/control points of a patterned substrate. The measurement points are evaluated to determine an amount and direction of shift (e.g., RunOut(X) and RunOut(Y)) of each of the measurement points relative to its respective target point. The table illustrates locations (L1-L10 of FIG. 5) of the measurement points (10 sets of measurement data) in an x-axis and y-axis, interpretations of the types of overlay (e.g., translational shift, rotation, magnification, trapezoid, etc.) in the x-axis and y-axis, and $Dist^2$ that is a summation of a shift at each location squared.

Row 2 shows interpretations of a magnification component in the x-axis (X: Magnification) and a rotational component in the y-axis (Y: Rotation). As discussed above with reference to FIG. 7A, locations (L1, L3, L5, L7, and L9) are shifted one unit to the right (1), and locations (L2, L4, L6, L8, and L10) are shifted one unit to the left (−1) in the x-axis, As discussed above with reference to FIG. 8B, the locations (L1, L3, L5, L7, and L9) are shifted one unit upwards (1), and the locations (L2, L4, L6, L8, and L10) are shifted one unit downwards (−1) in the y-axis. Accordingly, the X magnification and the Y Rotation both have a $Dist^2$ that is equal to a summation of a square of each shift at each location which is equal to $1^2+1^2+1^2+1^2+1^2+(-1)^2+(-1)^2+(-1)^2+(-1)^2+(-1)^2=10$. It is noted that the locations (L1, L3, L5, L7, L9, L2, L4, L6, L8, L10) are shifted in a similar manner (1, 1, 1, 1, 1, −1, −1, −1, −1, −1) for both overlay types X: Magnification and Y: Rotation.

Row 3 shows interpretations of a rotational component in the x-axis (X: Rotation) and a magnification component in the y-axis (Y: Magnification). The rotational component in the x-axis (similar to FIG. 8A) and the magnification component in the y-axis (similar to FIG. 7B) both have a $Dist^2$ equal to $2^2+1^2+0^2+(-1)^2+(-2)^2+2^2+1^2+0^2+(-1)^2+(-2)^2=20$. It is noted that the locations (L1, L3, L5, L7, L9, L2, L4, L6, L8, L10) are shifted in a similar manner (2, 1, 0, −1, −2, 2, 1, 0, −1, −2) for both overlay types X: Rotation and Y: Magnification.

Row 4 shows interpretations of a trapezoidal component in the x-axis (X: Trapezoid) and a trapezoidal component in the

| Coordinate | Location | | | | | | | | | | $Dist^2$ | Interpretations |
| --- | --- | --- | --- | --- | --- | --- | --- | --- | --- | --- | --- | --- |
| | L1 | L3 | L5 | L7 | L9 | L2 | L4 | L6 | L8 | L10 | | |
| 1 | 1 | 1 | 1 | 1 | 1 | 1 | 1 | 1 | 1 | 1 | 10 | X: Translational Shift<br>Y: Translational Shift |
| 2 | 1 | 1 | 1 | 1 | 1 | −1 | −1 | −1 | −1 | −1 | 10 | X: Magnification (Dilation)<br>Y: Rotation |
| 3 | 2 | 1 | 0 | −1 | −2 | 2 | 1 | 0 | −1 | −2 | 20 | X: Rotation<br>Y: Magnification (Dilation) |
| 4 | 2 | 1 | 0 | −1 | −2 | −2 | −1 | 0 | 1 | 2 | 20 | X: Trapezoid<br>Y: Trapezoid |
| 5 | 1 | 0 | −2 | 0 | 1 | 0 | 0 | 0 | 0 | 0 | 6 | X: Left Hat<br>Y: Left Vertical Twisting |
| 6 | 0 | 0 | 0 | 0 | 0 | 1 | 0 | −2 | 0 | 1 | 6 | X: Right Hat<br>Y: Right Vertical Twisting |
| 7 | 1 | −2 | 0 | 2 | −1 | 0 | 0 | 0 | 0 | 0 | 10 | X: Left S-Shape<br>Y: Left Vertical Twisting |
| 8 | 0 | 0 | 0 | 0 | 0 | 1 | −2 | 0 | 2 | −1 | 10 | X: Right S-Shape<br>Y: Right Vertical Twisting |
| 9 | 1 | −1.5 | 1 | −1.5 | 1 | 0 | 0 | 0 | 0 | 0 | 7.5 | X: Left Zigzag<br>Y: Left Zigzag |
| 10 | 0 | 0 | 0 | 0 | 0 | 1 | −1.5 | 1 | −1.5 | 1 | 7.5 | X: Right Zigzag<br>Y: Right Zigzag |

From the table above, row 1 shows interpretations of a translation shift in the x-axis (X: Translational Shift) and a translational shift in the y-axis (Y: Translational Shift). As discussed above with reference to FIGS. 6A and 6B, the locations (L1-L10) are shifted one unit to the right in the x-axis (1), and the locations (L1-L10) are shifted one unit upwards in the y-axis (1). Accordingly, the X translation and Y translation both have a $Dist^2$ that is equal to a summation of a square of each shift at each location which is equal to $1^2+1^2+1^2+1^2+1^2+1^2+1^2+1^2+1^2+1^2=10$. It is noted that the locations (L1, L3, L5, L7, L9, L9, L2, L4, L6, L8, L10) are shifted in a similar manner (1, 1, 1, 1, 1, 1, 1, 1, 1, 1) for both overlay types X: Translational Shift and Y: Translational Shift.

y-axis (Y: Trapezoid). The trapezoidal component in the x-axis (similar to FIG. 9A) and the trapezoidal component in the y-axis (similar FIG. 9B) both have a $Dist^2$ equal to $2^2+1^2+0^2+(-1)^2+(-2)^2+(-2)^2+(-1)^2+0^2+(1)^2+(2)^2=20$. It is noted that the locations (L1, L3, L5, L7, L9, L2, L4, L6, L8, L10) are shifted in a similar manner (2, 1, 9, −1, −2, −2, −1, 0, 1, 2) for both overlay types X: Trapezoid and Y: Trapezoid.

Rows 5-10 show various other overlay types (in the x-axis and y-axis) that may be determined in a similar technique as was discussed with reference to FIGS. 6-10. In row 5, the overlay types include X: Left Hat and Y: Left Vertical Twisting. In row 6, the overlay types include X: Right Hat and Y: Left Vertical Twisting. In row 7, the overlay types include X:

Left S-Shape and Y: Left Vertical Twisting. In row 8, the overlay types include X: Right S-Shape and Y: Right Vertical Twisting. In row 9, the overlay types include X: Left Zigzag and Y: Left Zigzag. In row 10, the overlay types include X: Right Zigzag and Y: Right Zigzag.

The method 400 continues with block 440 in which the transformation matrix is applied to the metrology data. The transformation matrix is configured to decompose the metrology data into components corresponding to the various overlay types as was discussed above (e.g., translational shift, rotational, magnification, trapezoid, etc.). Accordingly, the decomposition of the metrology data will make it easier to determine what extent of shifting has occurred in the x-axis and/or the y-axis following the e-beam process.

The method 400 continues with block 450 in which an overlay index is determined for the direct-write process. The overlay index denotes the various overlay types (e.g., X and Y: Translational Shift, X and Y: Rotation, X and Y: Magnification, X and Y: Trapezoid, etc.). For example, the overlay index may be associated with the $Dist^2$ (table above) of the various overlay types. Further, a magnitude of the overlay index may correspond to how much (e.g., strong or weak) a particular overlay type is within the measurement data. That is, the overlay index may indicate that the particular overlay type is contributing 10% or 90% to the patterning process. Accordingly, the overlay index may be utilized to control, monitor, and diagnose the patterning process as discussed below.

Figure 11:
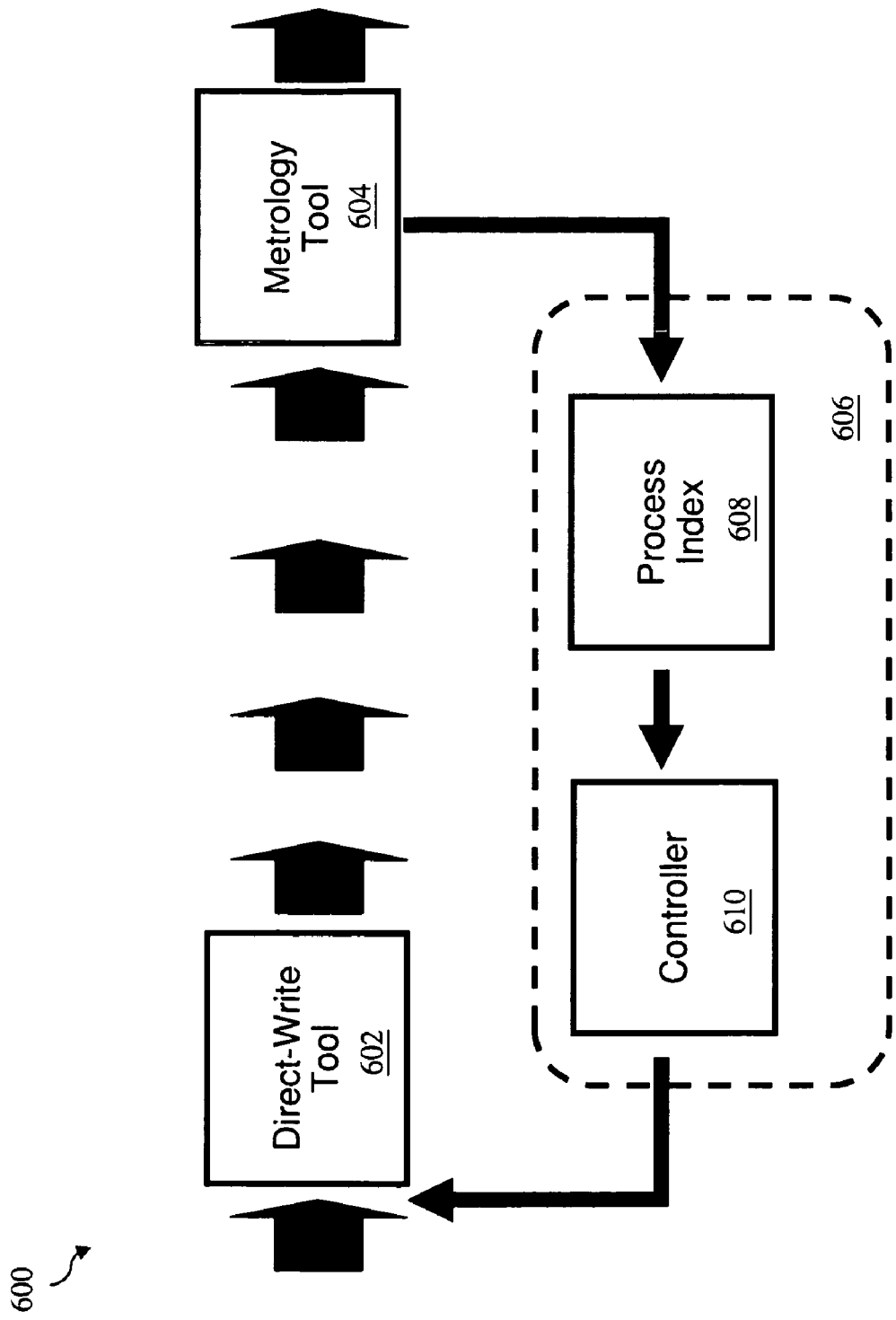
FIG. 11 is a block diagram of a process flow that implements a process index for controlling the process.

Referring to FIG. 11, illustrated is a block diagram of a process flow 600 that implements a process index for controlling the process. The process flow 600 is performed to pattern a substrate. The process flow 600 includes a direct-write tool 602 (similar to the DW system 100 of FIG. 1) that directly patterns (writes) the substrate using a beam of energy. The patterned substrate proceeds to a metrology tool 602 which inspects and measures the patterned substrate. The measurement data is provided (feedback information) to an APC system 606 for processing. The APC system 606 includes a module for calculating a process index 608 and a controller 610. The process index 608, for example, includes an overlay index that characterizes an overlay type (e.g., translational shift, rotation, magnification, trapezoid, S-shape, vertical twisting, zigzag, hat, etc.) of the patterned substrate.

The process index 608 is provided to the controller 610 of the APC system 608. The controller 610 can tune and adjust the direct-write tool 602 based on the process index 608 for patterning subsequent substrates. Further, a plurality of process indices may be provided to evaluate contributions of different overlay types within the measurement data. For example, a process index corresponding to rotation and another process index corresponding to magnification may be calculated. In some situations, the rotational component is larger than the magnification component within the measurement data, and thus the controller 610 can tune the direct-write tool 602 to account for more rotational distortion than magnification distortion. It is understood that the APC system 606 may comprise a computer or other suitable hardware/software that is capable of executing programs for controlling the direct-write tool 602. The computer is operable to perform actions including manipulating information (including determining the transformation matrix, decomposing the metrology data using the transformation matrix, etc.), receiving information, storing information, and transferring information. The information may include, for example, commands, process parameters, process recipe, measurement data, process data, and equipment status.

In an embodiment, the overlay index may used to monitor and diagnose the patterning process of the DW system. For example, the various overlay types can be independently evaluated based on their respective overlay index. Accordingly, contributions of each of the overlay types can be analyzed (e.g., Translation shift 0%, Magnification 51%, Rotation 22%, Trapezoid 8%, Others 19%) to monitor and diagnose the patterning process of the DW system. In another embodiment, the overlay index may be used in preventative maintenance and calibration of the DW system.

Although only a few exemplary embodiments of this invention have been described in detail above, those skilled in the art will readily appreciate that many modifications are possible in the exemplary embodiments without materially departing from the novel teachings and advantages of this invention. It is understood that various different combinations of the above-listed steps can be used in various sequences or in parallel, and there is no particular step that is critical or required. Also, features illustrated and discussed above with respect to some embodiments can be combined with features illustrated and discussed above with respect to other embodiments. Accordingly, all such modifications are intended to be included within the scope of this invention. For example, the methods and systems disclosed herein can be implemented to monitor and control overlay when patterning various substrates such as a wafer and a photomask.

What is claimed is:

1. A method for monitoring overlay of a direct-write system, comprising:
    providing a substrate having a pattern formed thereon by the direct-write system;
    generating data associated with the substrate pattern;
    decomposing the data by applying a transformation matrix; and
    determining an overlay index based on the decomposed data, the overlay index corresponding to a variation component of the substrate pattern relative to a target pattern.

2. The method of claim 1, wherein the transformation matrix is configured to decompose the data into one of a translational shift component, a magnification component, a rotation component, and a trapezoid component.

3. The method of claim 2, wherein the translational shift component corresponds to an amount the substrate pattern is translational shifted relative to the target pattern, the translational shift being in a first direction and a second direction perpendicular the first direction;
    wherein the magnification component corresponds to an amount the substrate pattern is magnified relative to the target pattern, the magnification being in a first direction and a second direction perpendicular to the first direction;
    wherein the rotation component corresponds to an amount the substrate pattern is rotated relative to the target pattern, the rotation being about a center axis of the target pattern; and
    wherein the trapezoid component corresponds to an amount a first portion of the substrate pattern in contracted and a second portion of the substrate pattern is stretched, the contraction and stretching being either in a first direction or a second direction perpendicular to the first direction.

4. The method of claim 1, wherein generating data associated with the substrate pattern includes:
    selecting a plurality of actual locations on the substrate pattern;
    measuring each of the actual locations in a first direction and a second direction perpendicular to the first direction; and determining a shift of each actual location relative to a respective target location on the target pattern, the shift being in the first direction and the second direction.

5. The method of claim 1, further comprising controlling the direct-write system based on the overlay index to pattern subsequent substrates.

6. The method of claim 1, further comprising calibrating the direct-write system based on the overlay index.

7. The method of claim 1, wherein the substrate includes one of a wafer and a photomask.

8. A method for controlling a direct-write system, comprising:
    patterning a current substrate by the direct-write system;
    determining metrology data of the current substrate pattern;
    decomposing the metrology data to determine an overlay type that corresponds to a geometric variation between the current substrate pattern and a target pattern; and
    patterning a next substrate by controlling the direct-write system based on the determined overlay type.

9. The method of claim 8, wherein the decomposing includes applying a transformation matrix to the metrology data, the transformation matrix configured to decompose the metrology data into one of a translational shift component, a magnification component, a rotation component, a trapezoid component, an S-shape component, a vertical twisting component, a hat-shape component, and a zigzag component.

10. The method of claim 9, further comprising determining an overlay index based on the overlay type, the overlay type corresponding to one of the translational shift component, the magnification component, the rotation component, the trapezoid component, the S-shape component, the vertical twisting component, the hat-shape component, and the zigzag component.

11. The method of claim 10, wherein the substrate includes one of a wafer and a photomask.

12. The method of claim 9, wherein the transformation matrix is determined by:
    selecting a plurality of target locations of the target pattern, the target locations being in a first direction and a second direction perpendicular to the first direction;
    determining a shift of each of the target locations associated with one of the translational shift component, the magnification component, the rotation component, a trapezoid component, the S-shape component, the vertical twisting component, the hat-shape component, and the zigzag component; and
    determining a square of a distance that is approximately equal to a summation of a square of each the determined shifts.

13. The method of claim 12, wherein determining the metrology data includes:
    selecting a plurality of actual locations on the current substrate pattern;
    measuring each of the actual locations in the first direction and the second direction; and
    determining another shift of each actual location relative to the respective target location, the another shift being in the first direction and the second direction.

14. The method of claim 8, further comprising:
    decomposing the metrology data to determine another overlay type that corresponds to another geometric variation between the current substrate pattern and a target pattern; and
    determining a first contribution of the overlay type on the current substrate pattern and a second contribution of the another overlay type on the current substrate pattern;
    wherein patterning the next substrate includes controlling the direct-write system based on whether the first contribution is smaller than the second contribution.

15. The method of claim 8, wherein the direct-write system utilizes an E-beam to pattern the current substrate and next substrate.

16. An direct-write system, comprising:
    an exposure module that includes a beam for writing to a current substrate; and
    a controller operable to execute instructions that:
        receive data of a previous substrate that has been patterned by the exposure module;
        decompose the data by applying a transformation matrix;
        determine an overlay index based on the decomposed data, the overlay index corresponding to a variation component of the previous substrate pattern relative to a target pattern; and
        control the exposure module to write to the current substrate based on the overlay index.

17. The system of claim 16, wherein the beam includes an E-beam.

18. The system of claim 16, wherein the substrate includes one of a wafer and a photomask.

19. The system of claim 18, wherein the transformation matrix is determined by instructions that:
    select a plurality of target locations of the target pattern, the target locations being in a first direction and a second direction perpendicular to the first direction;
    determining a shift of each of the target locations associated with one of the variation components; and
    determining a square of a distance that is approximately equal to a summation of a square of each of the determined shifts.

20. The system of claim 16, wherein the variation component includes one of a translational shift component, a magnification component, a rotation component, a trapezoid component, an S-shape component, a vertical twisting component, a hat-shape component, and a zigzag component.

* * * * *